(12) United States Patent
Baloglu et al.

(10) Patent No.: US 11,901,343 B2
(45) Date of Patent: Feb. 13, 2024

(54) SEMICONDUCTOR DEVICE WITH INTEGRATED HEAT DISTRIBUTION AND MANUFACTURING METHOD THEREOF

(71) Applicant: Amkor Technology Singapore Holding Pte. Ltd., Singapore (SG)

(72) Inventors: Bora Baloglu, Chandler, AZ (US); Ron Huemoeller, Gilbert, AZ (US); Curtis Zwenger, Chandler, AZ (US)

(73) Assignee: AMKOR TECHNOLOGY SINGAPORE HOLDING PTE. LTD., Singapore (SG)

(*) Notice: Subject to any disclaimer, the term of this patent is extended or adjusted under 35 U.S.C. 154(b) by 135 days.

(21) Appl. No.: 17/233,983

(22) Filed: Apr. 19, 2021

(65) Prior Publication Data

US 2021/0257346 A1    Aug. 19, 2021

Related U.S. Application Data

(63) Continuation of application No. 16/564,814, filed on Sep. 9, 2019, now Pat. No. 10,985,146, which is a
(Continued)

(51) Int. Cl.
*H01L 23/495* (2006.01)
*H01L 25/10* (2006.01)
(Continued)

(52) U.S. Cl.
CPC .......... *H01L 25/105* (2013.01); *H01L 21/486* (2013.01); *H01L 21/4853* (2013.01);
(Continued)

(58) Field of Classification Search
CPC . H01L 25/105; H01L 23/3677; H01L 23/367; H01L 23/36; H01L 23/3672;
(Continued)

(56) References Cited

U.S. PATENT DOCUMENTS

| 5,276,289 A | 1/1994 | Satoh et al. |
| 6,177,731 B1 | 1/2001 | Ishida et al. |

(Continued)

FOREIGN PATENT DOCUMENTS

| JP | 2003060523 | 2/2003 |
| JP | 2010130003 | 6/2010 |

(Continued)

*Primary Examiner* — Ismail A Muse
(74) *Attorney, Agent, or Firm* — McAndrews, Held & Malloy, Ltd.

(57) ABSTRACT

A semiconductor package having an internal heat distribution layer and methods of forming the semiconductor package are provided. The semiconductor package can include a first semiconductor device, a second semiconductor device, and an external heat distribution layer. The first semiconductor device can comprise a first semiconductor die and an external surface comprising a top surface, a bottom surface, and a side surface joining the bottom surface to the tope surface. The second semiconductor device can comprise a second semiconductor die and can be stacked on the top surface of the first semiconductor device. The external heat distribution layer can cover an external surface of the second semiconductor device and the side surface of the first semiconductor device. The external heat distribution layer further contacts an internal heat distribution layer on a top surface of the first semiconductor die.

20 Claims, 7 Drawing Sheets

Related U.S. Application Data continuation of application No. 15/847,242, filed on Dec. 19, 2017, now Pat. No. 10,410,999.

(51) Int. Cl.

| | |
|---|---|
| *H01L 23/373* | (2006.01) |
| *H01L 23/538* | (2006.01) |
| *H01L 21/48* | (2006.01) |
| *H01L 21/56* | (2006.01) |
| *H01L 25/00* | (2006.01) |
| *H01L 23/552* | (2006.01) |
| *H01L 23/00* | (2006.01) |
| *H01L 23/367* | (2006.01) |
| *H01L 23/36* | (2006.01) |
| *H01L 25/065* | (2023.01) |

(52) U.S. Cl.
CPC ...... *H01L 21/4857* (2013.01); *H01L 21/4882* (2013.01); *H01L 21/565* (2013.01); *H01L 23/36* (2013.01); *H01L 23/367* (2013.01); *H01L 23/3672* (2013.01); *H01L 23/3675* (2013.01); *H01L 23/3677* (2013.01); *H01L 23/3736* (2013.01); *H01L 23/5383* (2013.01); *H01L 23/5384* (2013.01); *H01L 23/5386* (2013.01); *H01L 23/5389* (2013.01); *H01L 23/552* (2013.01); *H01L 24/19* (2013.01); *H01L 24/20* (2013.01); *H01L 25/0657* (2013.01); *H01L 25/50* (2013.01); H01L 24/13 (2013.01); H01L 24/16 (2013.01); H01L 24/32 (2013.01); H01L 24/73 (2013.01); H01L 24/81 (2013.01); H01L 24/92 (2013.01); H01L 2224/0401 (2013.01); H01L 2224/131 (2013.01); H01L 2224/13082 (2013.01); H01L 2224/16145 (2013.01); H01L 2224/16227 (2013.01); H01L 2224/214 (2013.01); H01L 2224/32135 (2013.01); H01L 2224/32145 (2013.01); H01L 2224/32225 (2013.01); H01L 2224/48145 (2013.01); H01L 2224/48227 (2013.01); H01L 2224/73204 (2013.01); H01L 2224/81005 (2013.01); H01L 2224/81203 (2013.01); H01L 2224/81224 (2013.01); H01L 2224/81815 (2013.01); H01L 2224/92125 (2013.01); H01L 2224/97 (2013.01); H01L 2225/06589 (2013.01); H01L 2225/1035 (2013.01); H01L 2225/1058 (2013.01); H01L 2225/1094 (2013.01); H01L 2924/1433 (2013.01); H01L 2924/1434 (2013.01); H01L 2924/14335 (2013.01); H01L 2924/15311 (2013.01); H01L 2924/19105 (2013.01); H01L 2924/19107 (2013.01); H01L 2924/3025 (2013.01); H01L 2924/3511 (2013.01)

(58) Field of Classification Search
CPC ............ H01L 25/0657; H01L 23/3736; H01L 23/5389; H01L 23/5383; H01L 23/5384; H01L 23/5386; H01L 21/4882; H01L 21/4857; H01L 21/486; H01L 21/4853; H01L 21/565; H01L 25/50; H01L 23/552; H01L 24/20; H01L 24/19; H01L 23/3675; H01L 2224/131; H01L 2224/81815; H01L 2924/3511; H01L 2224/97; H01L 2924/3025; H01L 2224/0401; H01L 2224/92125; H01L 2924/19107; H01L 2924/15311; H01L 24/73; H01L 2224/48227; H01L 2224/81203; H01L 2224/16227; H01L 2224/32225; H01L 2224/81224; H01L 2924/1434; H01L 24/92; H01L 24/32; H01L 2924/14335; H01L 2924/19105; H01L 24/13; H01L 2224/73204; H01L 24/81; H01L 2224/81005; H01L 2224/13082; H01L 24/16; H01L 2924/1433; H01L 2225/06589; H01L 2224/32135; H01L 2224/48145; H01L 2224/32145; H01L 2224/16145; H01L 2224/214; H01L 2225/1035; H01L 2225/1058; H01L 2225/1094; H01L 25/0655; H01L 2225/1041; H01L 2221/68345; H01L 21/568; H01L 21/6835; H01L 23/3128

See application file for complete search history.

(56) References Cited

U.S. PATENT DOCUMENTS

| | | | |
|---|---|---|---|
| 6,546,620 B1 | 4/2003 | Juskey et al. | |
| 7,163,843 B2 | 1/2007 | Kiendl | |
| 7,196,411 B2 | 3/2007 | Chang | |
| 7,429,792 B2 | 9/2008 | Lee et al. | |
| 7,741,151 B2 | 6/2010 | Amrine | |
| 8,106,497 B2 | 1/2012 | Brunnbauer et al. | |
| 8,299,608 B2 | 10/2012 | Bartley et al. | |
| 8,378,466 B2 | 2/2013 | Chiu | |
| 8,420,437 B1 | 4/2013 | Fan | |
| 8,618,648 B1 | 12/2013 | Kwon et al. | |
| 8,901,718 B2 | 12/2014 | Cho | |
| 9,070,693 B2 | 6/2015 | Cho | |
| 9,355,985 B2 | 5/2016 | Vincent et al. | |
| 9,425,156 B2 | 8/2016 | Jung et al. | |
| 9,595,485 B2 | 3/2017 | Vincent et al. | |
| 9,780,074 B2 | 10/2017 | Kim et al. | |
| 2001/0045644 A1 | 11/2001 | Huuang | |
| 2003/0102546 A1 | 6/2003 | Lee | |
| 2003/0164540 A1 | 9/2003 | Lee | |
| 2004/0195686 A1 | 10/2004 | Jobetto et al. | |
| 2006/0060963 A1 | 3/2006 | Chang | |
| 2006/0268519 A1 | 11/2006 | Bartley et al. | |
| 2007/0126127 A1 | 6/2007 | Jobetto et al. | |
| 2007/0126128 A1 | 6/2007 | Jobetto et al. | |
| 2008/0001283 A1 | 1/2008 | Lee et al. | |
| 2009/0200665 A1 | 8/2009 | Jobetto et al. | |
| 2009/0294947 A1 | 12/2009 | Tain et al. | |
| 2010/0126765 A1 | 5/2010 | Kim et al. | |
| 2011/0147916 A1 | 6/2011 | Su | |
| 2011/0254156 A1 | 10/2011 | Lin | |
| 2012/0008288 A1* | 1/2012 | Tsukamoto | H05K 9/0037 361/736 |
| 2012/0043669 A1 | 2/2012 | Refai-Ahmed et al. | |
| 2012/0074585 A1 | 3/2012 | Koo et al. | |
| 2012/0104592 A1 | 5/2012 | Brunnbauer et al. | |
| 2012/0243199 A1* | 9/2012 | Wu | H01L 23/552 361/818 |
| 2013/0105989 A1 | 5/2013 | Pagaila et al. | |
| 2013/0127025 A1 | 5/2013 | Cho | |
| 2013/0187292 A1 | 7/2013 | Semmelmeyer et al. | |
| 2013/0217189 A1 | 8/2013 | Sasaki | |
| 2013/0277829 A1 | 10/2013 | Yee et al. | |
| 2013/0320548 A1* | 12/2013 | Carpenter | H01L 23/3135 257/772 |
| 2014/0048913 A1 | 2/2014 | Park et al. | |
| 2014/0061888 A1 | 3/2014 | Lin et al. | |
| 2014/0091473 A1 | 4/2014 | Len et al. | |
| 2014/0138817 A1 | 5/2014 | Paek et al. | |
| 2014/0147970 A1 | 5/2014 | Kim et al. | |
| 2014/0183723 A1 | 7/2014 | Ayotte et al. | |
| 2014/0217610 A1 | 8/2014 | Jeng et al. | |
| 2014/0231991 A1 | 8/2014 | Yee et al. | |
| 2014/0248742 A1 | 9/2014 | Gonzalez et al. | |
| 2014/0262475 A1* | 9/2014 | Liu | H01L 21/4817 174/377 |
| 2014/0299976 A1 | 10/2014 | Cho | |
| 2014/0327129 A1 | 11/2014 | Cho et al. | |
| 2014/0327145 A9 | 11/2014 | Pagaila et al. | |

(56) References Cited

U.S. PATENT DOCUMENTS

| | | |
|---|---|---|
| 2015/0017764 A1 | 1/2015 | Lin et al. |
| 2015/0028477 A1 | 1/2015 | Jung et al. |
| 2015/0028478 A1 | 1/2015 | Meyer et al. |
| 2015/0137345 A1 | 5/2015 | Choi et al. |
| 2015/0255422 A1 | 9/2015 | Paek et al. |
| 2015/0303170 A1 | 10/2015 | Kim et al. |
| 2015/0348865 A1 | 12/2015 | Vincent et al. |
| 2016/0086918 A1 | 3/2016 | Lin et al. |
| 2016/0148857 A1 | 5/2016 | Lin et al. |
| 2016/0233196 A1 | 8/2016 | Kim et al. |
| 2016/0276174 A1 | 9/2016 | Kim et al. |
| 2016/0322317 A1 | 11/2016 | Paek et al. |
| 2016/0329285 A1 | 11/2016 | Jung et al. |
| 2016/0351509 A1 | 12/2016 | Dang |
| 2017/0040290 A1 | 2/2017 | Lin et al. |
| 2017/0133310 A1 | 5/2017 | Kelly et al. |
| 2017/0141046 A1 | 5/2017 | Jeong et al. |
| 2017/0141081 A1 | 5/2017 | Lee et al. |
| 2017/0154861 A1 | 6/2017 | Paek et al. |
| 2017/0358540 A1* | 12/2017 | Min ............ H01L 23/552 |

FOREIGN PATENT DOCUMENTS

| | | |
|---|---|---|
| JP | 2010-0239126 | 10/2010 |
| JP | 2011082293 | 4/2011 |
| KR | 20030083553 | 10/2003 |
| KR | 10-2004-0047902 | 6/2006 |
| KR | 10-2011-0114155 | 10/2011 |
| KR | 20120032772 | 4/2012 |
| KR | 10-2013-000-8666 | 1/2013 |
| KR | 20130056570 | 5/2013 |
| KR | 10-2013-0118757 | 10/2013 |
| KR | 20140002458 | 1/2014 |
| KR | 101366461 | 2/2014 |
| KR | 20140023112 | 2/2014 |
| KR | 10-2014-0030014 | 3/2014 |
| KR | 1020140042620 | 4/2014 |
| KR | 10-2015-0000173 | 1/2015 |
| KR | 101479248 | 1/2015 |
| KR | 10-2015-0014568 | 2/2015 |
| KR | 20150123128 | 11/2015 |
| KR | 20150135048 | 12/2015 |

\* cited by examiner

SEMICONDUCTOR DEVICE WITH INTEGRATED HEAT DISTRIBUTION AND MANUFACTURING METHOD THEREOF

BACKGROUND

Present semiconductor packages and methods for forming semiconductor packages are inadequate, for example resulting in excess cost, decreased reliability, or package sizes that are too large. For example, conventional techniques can package several semiconductor dies together. Such packaging can result in one or more semiconductor dies being deeply embedded within the semiconductor package.

During operation, semiconductor dies can generate significant amounts of thermal energy to be dissipated and expelled from the semiconductor package. Inadequate thermal dissipation can result in thermal breakdown and other thermal-related failures of the packaged semiconductor dies.

Further limitations and disadvantages of conventional and traditional approaches will become apparent to one of skill in the art, through comparison of such approaches with the present disclosure as set forth in the remainder of the present application with reference to the drawings.

DETAILED DESCRIPTION OF VARIOUS ASPECTS OF THE DISCLOSURE

Figure 1:
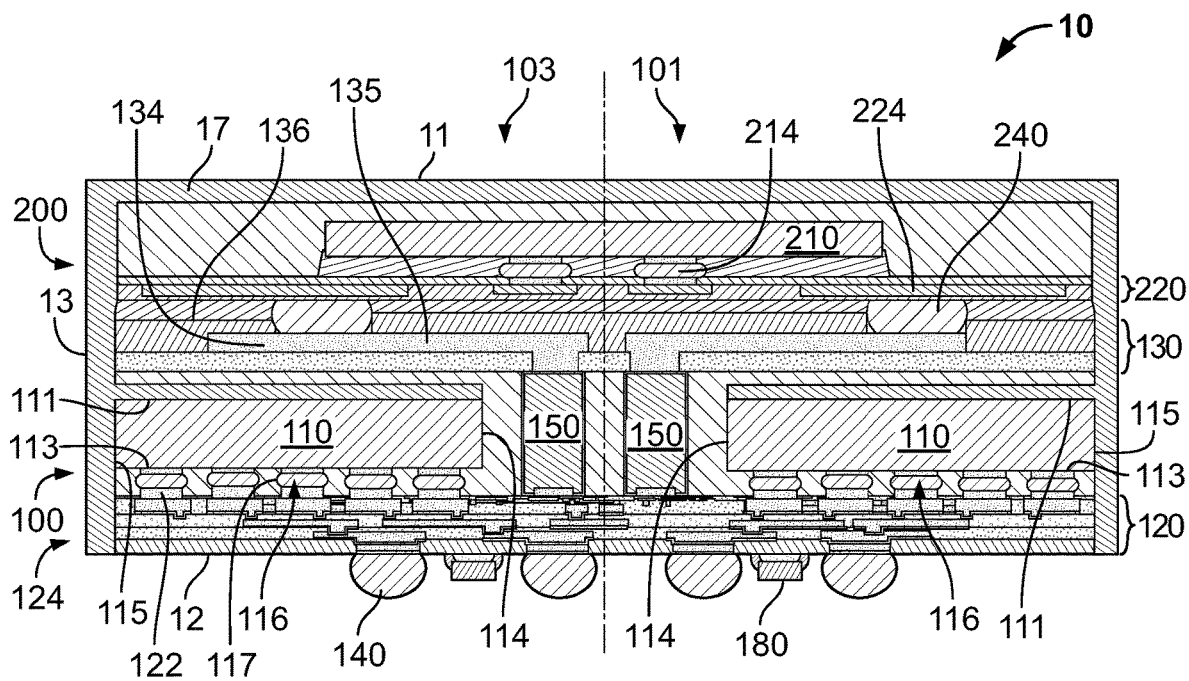
FIG. 1 shows a vertical cross-section of an example embodiment of a semiconductor package in accordance with various aspects of the present disclosure.

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

In particular, various aspects of this disclosure are directed to semiconductor devices having internal heat distribution layers and methods for manufacturing such semiconductor devices. For example and without limitation, a semiconductor device can include a first semiconductor device, a second semiconductor device, and an external heat distribution layer. The first semiconductor device can include a first semiconductor die and an external surface comprising a top surface, a bottom surface, and a side surface joining the bottom surface to the tope surface. The first semiconductor device can also include an internal heat distribution layer on a top surface of the first semiconductor die. The internal heat distribution layer can extend to the side surface of the first semiconductor device. The second semiconductor device can include a second semiconductor die stacked on the top surface of the first semiconductor device. The external heat distribution layer can cover an external surface of the second semiconductor device and the side surface of the first semiconductor device. The external heat distribution layer can also contact the internal heat distribution layer along the side surface of the first semiconductor device.

For example and without limitation, a method of manufacturing a semiconductor package can include forming an internal heat distribution layer on a top surface of a first semiconductor die, where the first semiconductor die has micro bumps attached to micro pads of a substrate. The method can also include forming an internal electrical interconnect structure electrically connected to the substrate and encapsulating the first semiconductor die and the internal electrical interconnect structure in an encapsulant. The method can further include planarizing an upper surface of the encapsulant to expose an upper surface of the internal electrical interconnect structure and forming an interposer over the upper surface of the encapsulant such that the interposer is electrically connected to the upper surface of the internal electrical interconnect. Further, the method can include stacking a semiconductor device comprising a second semiconductor die on the interposer such that electrical connectors on a bottom surface of the semiconductor device are electrically connected to the interposer. The method can also include forming an external heat distribution layer over the semiconductor device and a side surface of the encapsulant such that the external heat distribution layer contacts the internal heat distribution layer at the side surface of the encapsulant.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components can be oriented in different manners, for example a semiconductor device can be turned sideways so that its "top" surface is facing horizontally and its "side" surface is facing vertically, without departing from the teachings of the present disclosure. Additionally, the term "on" will be utilized in the document to mean both "on" and "directly on" (e.g., with no intervening layer).

Furthermore, the term "coplanar" and similar terms are used herein to denote two surfaces that lie within the same plane. Coplanar surfaces can be adjacent or adjoining each other; however non-adjacent and/or non-adjoining surfaces can also be coplanar. For example, a gap, a void, and/or other structures may be interposed between the coplanar surfaces. Furthermore, due to manufacturing tolerances, thermal expansion, and the like, slight deviations can exist in coplanar surfaces. Such deviations can result in one surface being slightly higher than the other surface, thus forming a step-off (e.g., a step-up or step-down) between surfaces. As used herein, the term "coplanar" includes surfaces having a step-off ranging between 0 and 7 microns.

In the drawings, various dimensions (e.g., layer thickness, width, etc.) may be exaggerated for illustrative clarity. Additionally, like reference numbers are utilized to refer to like elements through the discussions of various examples.

The discussion will now refer to various example illustrations provided to enhance the understanding of the various aspects of the present disclosure. It should be understood that the scope of this disclosure is not limited by the specific characteristics of the examples provided and discussed herein.

Referring now to FIG. 1, a cross-sectional view is provided that depicts a semiconductor package 10 that packages or encloses one or more semiconductor dies within external package surfaces. In particular, the semiconductor package 10 has a top surface 11, a bottom surface 12 opposite the top surface 11, and one or more side surfaces 13 that join the top surface 11 to the bottom surface 12. Moreover, the semiconductor package 10 comprises an external heat distribution layer 17 that in the depicted embodiment defines the top surface 11 and the one or more side surfaces 13 of the package 10. As explained in greater detail below, the external heat distribution layer 17 can be thermally coupled to one or more interior semiconductor dies in the semiconductor package 10 so as to aid in drawing heat away from the interior semiconductor dies and dissipating such drawn heat to the environment surrounding the semiconductor package 10. In some examples, the external heat distribution layer 17 can be referred to as an external conductive layer or lid. In the same or other examples, the external heat distribution layer 17 can also or instead be at least part of an electromagnetic-interference (EMI) shield.

As shown, the semiconductor package 10 can include a first semiconductor device 100 and a second semiconductor device 200 stacked upon the first semiconductor device 100. The first semiconductor device 100 can include a plurality of first semiconductor dies 110, a substrate 120, an interposer 130, external electrical connectors 140, and internal electrical interconnect structures 150. While two first semiconductor dies 110 are shown, some embodiments of the semiconductor device 100 can include more than two first semiconductor dies 110. Moreover, each first semiconductor die 110 can be structurally implemented in a similar manner. As such, similar aspects of the first semiconductor dies 110 are labeled with the same reference labels in the figures.

As shown, each first semiconductor die 110 can each include one or more integrated circuit components electrically coupled to one or conductive bumps 116 of its respective first semiconductor die 110. Moreover, each first semiconductor die 110 can each have a top surface 111, a bottom surface 113 parallel to the top surface 111, and one or more side surfaces or walls adjoining the top surface 111 to the bottom surface 113. In one embodiment, the side walls include an inner sidewall 114, and outer sidewall 115, a front sidewall 118, and a backside wall 119. See, e.g., FIG. 4.

In one embodiment, each first semiconductor die 110 can have the same integrated circuit components. In other embodiments, one or more of the first semiconductor dies 110 can be implemented using a dummy die having no active circuit components. In yet other embodiments, one or more of the first semiconductor dies 110 can have integrated circuit components that differ from integrated circuit components of the other first semiconductor dies 110. In such an embodiment, one or more of the first semiconductor dies 110 can provide different functionality than the other first semiconductor dies 110.

The substrate 120 can provide a redistribution structure that includes one or more conductive layers that operatively couple the bumps 116 of each first semiconductor die 110 to the one or more external electrical connectors 140. In this manner, the integrated circuit components of the first semiconductor dies 110 can be operatively coupled to the one or more external electrical connectors 140 via the substrate 120. The external electrical connectors 140 can comprise conductive bumps, conductive balls, conductive pillars, conductive lands, conductive pads, etc. Furthermore, the external electrical connectors 140 can be formed of conductive materials such as any one of or a combination of copper, nickel, gold, solder, etc. For convenience and ease of description, the external electrical connectors 140 are hereafter referred to as balls 140.

The interposer 130 can be positioned above the top surface 111 of the first semiconductor dies 110 such that the first semiconductor dies 110 are disposed between the substrate 120 and the interposer 130. The term "interposer" is used herein to refer to a general redistribution structure (e.g., a dielectric and conductor layered structure) that redistributes signals vertically and laterally and/or is interposed between other structures. To this end, the interposer 130 can be operatively coupled to the substrate 120 via one or more internal electrical interconnect structures 150. The internal electrical interconnect structures 150 can comprise any of a variety of characteristics. For example, the internal electrical interconnect structures 150 can comprise solder balls, solder bumps, multi-ball solder columns, elongated solder balls, metal (e.g., copper) core balls with a layer of solder over a metal core, plated pillar structures (e.g., copper pillars, etc.), wire structures (e.g., wire bonding wires), or other through mold via (TMV) structures. For convenience and ease of description, the internal electrical interconnect structures 150 are hereafter referred to as pillars 150.

As depicted, the pillars 150 can be positioned between side walls 114 of the first semiconductor dies 110. The conductive layers 124 of the substrate 120 can further operatively couple the interposer 130 to the one or more balls 140 via the pillars 150.

The interposer 130 can further include one or more conductive layers defining one or more traces 135 and/or one or more pads or landings 134 on an upper surface 136 of the interposer 130. Such pads 134 can provide electrical connections for operatively coupling additional electrical components such as the second semiconductor device 200 to the balls 140 via the interposer 130 and the pillars 150.

As shown, the second semiconductor device 200 can include a second semiconductor die 210, a substrate 220, and electrical connectors 240. The electrical connectors 240 can be implemented in a similar manner as the external electrical connectors 140. As such, electrical connectors 240 are likewise hereinafter referred to as balls 240. The second semiconductor die 210 can include one or more integrated circuit components which are operatively coupled to the substrate 220 via one or more bumps 214 of the second semiconductor die 210. The substrate 220 can provide a redistribution structure that includes one or more conductive layers 224, which operatively couple the bumps 214 to the one or more balls 240. In this manner, the integrated circuit components of the second semiconductor die 210 can be operatively coupled to the one or more balls 240 via the substrate 220. In some embodiments, the second semiconductor device 200 may include more than one second semiconductor die 210. In the same or other embodiments, the semiconductor dies 210 may be coupled to substrate 220 via wirebonds rather than via bumps 214.

Moreover, the second semiconductor device 200 can be stacked upon the first semiconductor device 100 such that the balls 240 are affixed to the one or more pads or landings 134 on the upper surface 136 of the interposer 130. In this manner, the integrated circuit components of the second semiconductor device 200 can be operatively coupled to the balls 140 of the first semiconductor device 100 via the interposer 130 and the pillars 150 of the first semiconductor device 100.

The semiconductor dies 110, 210 can comprise any of a variety of types of semiconductor dies, non-limiting examples of which are provided herein. For example, the semiconductor dies 110, 210 can comprise a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc. The semiconductor package 10 can include in addition to the dies 110, 210 one or more passive electrical components 180 such as, for example, resistors, capacitors, etc. In some embodiments, one or more of semiconductor dies 110, 210 can instead be an electronic package that itself comprises a semiconductor die, or a passive component.

Figure 2A:
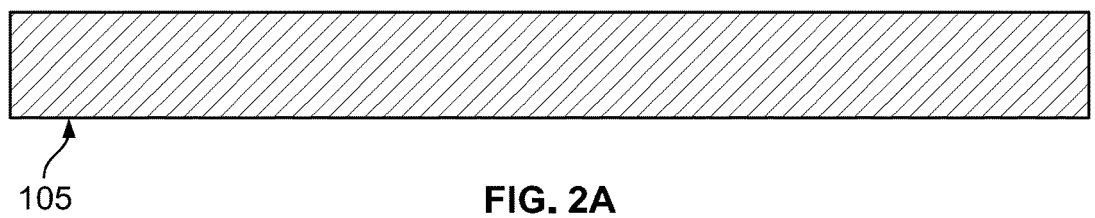
FIGS. 2A-2K show vertical cross-sections illustrating an example method of manufacturing the semiconductor package of FIG. 1.

Referring to FIGS. 2A-2M, cross-sectional views illustrating a method of manufacturing the semiconductor package 10 of FIG. 1 are shown. As shown in FIG. 2A, a carrier 105 can provide a planar top surface and a planar bottom surface. The carrier 105 can comprise any of a variety of different types of carrier materials. The carrier 105 can, for example, comprise a semiconductor material (e.g., silicon, GaAs, etc.), a glass material, a ceramic material, a metal material, etc. The carrier 105 can also comprise any of a variety of different types of configurations. For example, the carrier 105 can be in a mass form (e.g., a wafer form, a rectangular panel form, etc.). Also for example, the carrier 105 can be in a singular form (e.g., singulated from a wafer or panel, originally formed in a singular form, etc.).

Figure 2B:
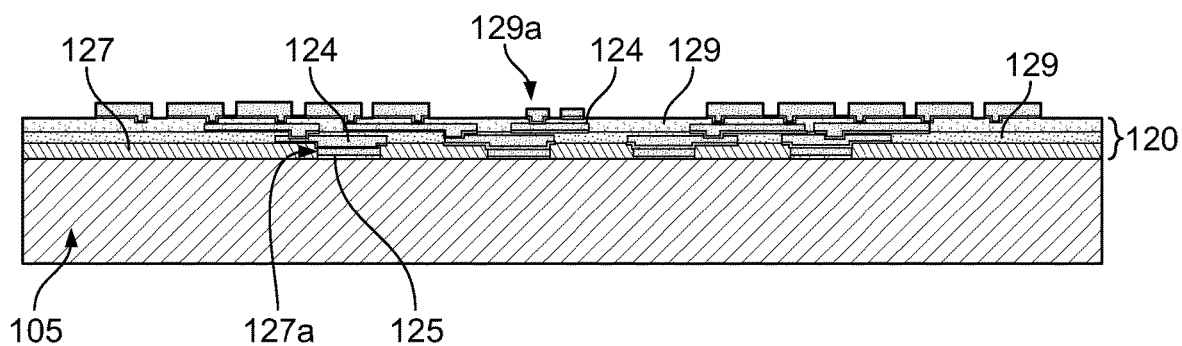

As shown in FIG. 2B, multiple layers forming the substrate 120 can be built upon the carrier 105. For example, an under bump metal (UBM) 125 of at least one layer can be directly formed on the carrier 105. In one example implementation, the under bump metal 125 can be formed of any of a variety of materials, non-limiting examples of which are presented herein. For example, the under bump metal 125 can be formed of at least one of chrome, nickel, palladium, gold, silver, alloys thereof, combinations thereof, equivalents thereof, etc. The under bump metal 125 can, for example, comprise Ni and Au. The under bump metal 125 can also, for example, comprise Cu, Ni, and Au.

The under bump metal 125 can be also formed utilizing any of a variety of processes, non-limiting examples of which are presented herein. For example, the under bump metal 125 can be formed utilizing one or more of an electroless plating process, electroplating process, sputtering process, etc. on the carrier 105. The under bump metal 125 can, for example, prevent or inhibit the formation of an intermetallic compound at the interface between the balls 140 and the conductive layer 124, thereby improving the reliability of the connection to the conductive balls 140. The under bump metal 125 can comprise multiple layers on the carrier 105. For example, the under bump metal 125 can comprise a first layer of Ni and a second layer of Au.

The under bump metal 125 can then be covered with a first dielectric layer 127 such as an organic layer (e.g., polymers such as polyimide, Benzocyclobutene (BCB), Polybenzoxazole (PBO), equivalents thereof, combinations thereof, etc.), which can also be referred to as a passivation layer. For example, the first dielectric layer 127 can be formed on the under bump metal 125 and the top surface of the carrier 105. The first dielectric layer 127 can be formed utilizing one or more of spin coating, spray coating, dip coating, rod coating, equivalents thereof, combinations thereof, etc., but the scope of the present disclosure is not limited thereto. As an example, the first dielectric layer 127 can be formed by laminating a dry film.

An opening 127a (or aperture) can, for example, be formed in the first dielectric layer 127, and a specific area of the under bump metal 125 (e.g., the entire top surface, a portion of the top surface, a center region of the top surface, etc.) can be exposed through the opening 127a. The opening 127a can be formed in any of a variety of manners (e.g., mechanical and/or laser ablation, chemical etching, photolithography, etc.). The first dielectric layer 127 (or any dielectric layer discussed herein) can also be originally formed having opening 127a, for example by masking, or other selective dielectric layer formation process.

The conductive layer 124 can be formed on the under bump metal 125 and the first dielectric layer 127. For example, the conductive layer 124 can be coupled to the under bump metal 125. In one example implementation, a seed layer can be formed on the under bump metal 125 and the first dielectric layer 127. The seed layer and/or any seed layer discussed herein can be formed of any of a variety of materials, including but not limited to tungsten, titanium, equivalents thereof, combinations thereof, alloys thereof, etc. The seed layer can be formed utilizing any of a variety of processes. For example, the seed layer can be formed utilizing one or more of an electroless plating process, an electrolytic plating process, a sputtering process, etc. For example, the seed layer can be formed of TiW with a Cu target. Also, any seed layer discussed herein can be formed utilizing the same or similar materials and/or processes, or can be formed utilizing different respective materials and/or processes. Additionally, the seed layer and/or any seed layer discussed herein can comprise multiple layers. As an example, the seed layer can comprise a first TiW layer and a second Cu layer.

The conductive layer 124 can then be formed on the seed layer. The conductive layer 124 and/or the forming thereof can, for example, share any or all characteristics with any other conductive layer and/or the forming thereof discussed herein. The conductive layer 124 can be formed of any of a variety of materials. For example, the conductive layer 124 can be formed of copper, aluminum, gold, silver, palladium, equivalents thereof, combinations thereof, alloys thereof, other conductive materials, etc.

The conductive layer 124 can be formed utilizing any of a variety of processes. For example, the conductive layer 124 can be formed utilizing one or more of an electroless plating process, an electrolytic plating process, a sputtering process, etc. The patterning or routing of the conductive layer 124 can, for example, be accomplished utilizing any of a variety of processes. For example, the conductive layer 124 can be patterned or routed utilizing a photoetching process using a photoresist, etc. For example, photoresist can be spin coated (or otherwise applied, such as a dry film, etc.) on a seed layer. The photoresist can then be set using, for example, a masking and illumination process. Then portions of the photoresist can be etched away, residual photoresist can be removed in a descum process, and drying (e.g., spin rinse drying) can be performed to form a template of photoresist. After forming the conductive layer 124, the template can be stripped (e.g., chemically stripped, etc.), and the seed layer that is exposed from the conductive layer 124 can be etched.

Any conductive layer discussed herein can be formed utilizing the same or similar materials and/or processes, or can be formed utilizing different respective materials and/or processes. Additionally, the conductive layer 124, and/or the forming thereof, can share any or all characteristics with any other conductive layer, and/or the forming thereof, disclosed herein.

The conductive layer 124 can then be covered with a second dielectric layer 129. The second dielectric layer 129 can be referred to as a passivation layer. The conductive layer 124 and its covering dielectric layer 129 can be referred to as a redistribution layer.

The second dielectric layer 129 can be formed of any of a variety of materials. For example, the second dielectric layer 129 can be formed of an organic material (e.g., polymers such as polyimide, Benzocyclobutene (BCB), Polybenzoxazole (PBO), equivalents thereof, combinations thereof, etc.). Also for example, the second dielectric layer 129 can be formed of an inorganic material. The second dielectric layer 129 can be formed utilizing any of a variety of processes. For example, the second dielectric layer 129 can be formed utilizing one or more of spin coating, spray coating, dip coating, rod coating, equivalents thereof, combinations thereof, etc. The second dielectric layer 129 and/or any dielectric layer discussed herein can also be referred to as a passivation layer. Also, any dielectric layer discussed herein can be formed utilizing the same or similar materials and/or processes, or can be formed utilizing different respective materials and/or processes. Additionally, the second dielectric layer 129, and/or the forming thereof, can share any or all characteristics with any other dielectric layer, and/or the forming thereof, disclosed herein.

Figure 2C:
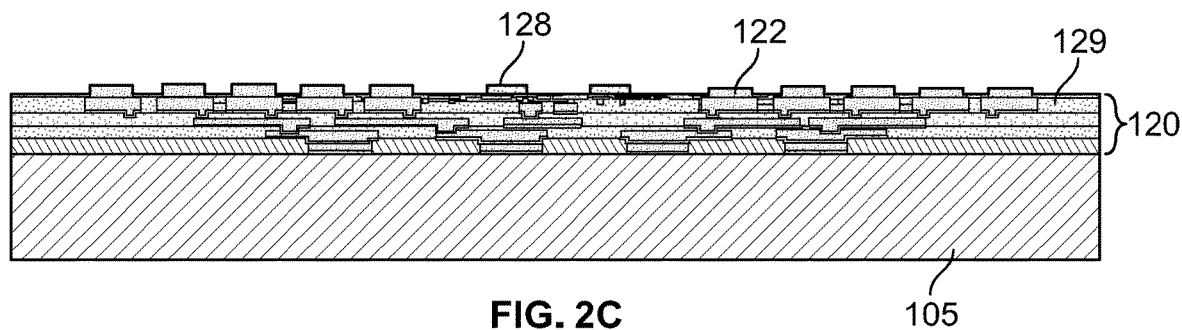

Formation of the conductive layer 124, with or without a seed layer, and the second dielectric layer 129 can be repeated any number of times utilizing the same materials and/or processes or different respective materials and/or processes. The example illustrations in FIGS. 2B and 2C shows two formations of such layers. As such, the layers are provided with similar labels in the figures (e.g., repeating the conductive layer 124 and the second dielectric layer 129). In some embodiments, one or more of the dielectric layers 129 can be formed to comprise a thickness of approximately 7 µm to 14 µm. In the same or other examples, one or more of the conductive layers 124 can be formed to comprise a thickness of approximately 3 µm to 9 µm. For instance, one example may comprise dielectric layers 129 with a thickness of up to 11 µm, and/or with conductive layers 124 with a thickness of up to 4 µm.

Openings or apertures 129a can be formed in the second dielectric layer 129 at specific areas to expose the underlying conductive layer 124. The openings 129a can be formed in any of a variety of manners (e.g., mechanical and/or laser ablation, chemical etching, photolithography, etc.). The second dielectric layer 129 (or any dielectric layer discussed herein) can also be originally formed having opening 129a by, for example, masking or another selective dielectric layer formation process. For discussion purposes herein, the conductive layers 124 and the dielectric layers 127, 129 can be considered to be components of the substrate 120. Furthermore, the under bump metal 125 and the pads 126 described herein can also be considered to be components of the substrate 120.

Moreover, the method of manufacturing depicted in FIGS. 2A-2K depicts the construction or build-up of substrate 120 on the carrier 105. However, in some embodiments, the substrate 120 can be implemented as a laminate substrate (e.g., a pre-fabricated printed-circuit board (PCB) supplied by a third party) or manufactured without the aid of a carrier 105. As such, some embodiments of the manufacturing method can lack a carrier 105 or can begin with a pre-fabricated substrate 120, thus effectively eliminated the process shown in FIGS. 2A and 2B.

As shown in FIG. 2C, micro bump pads, other pads, landings, attachment structures, or die attachment structures 122 can be formed such that each pad 122 is electrically connected to an underlying conductive layer 124. Similarly, each pillar pad or under bump metal 128 can be formed such that the pad 128 is electrically connected to an underlying conductive layer 124. Such underlying conductive layers 124 can provide a conductive path that electrically couples pads 128 and their pillars 150 to respective balls 140 or attachment structure 116 of the semiconductor die 110. (See, e.g., FIG. 1.)

In an example implementation, each micro bump pad 122 has a diameter between 15 µm and 45 µm. Moreover, the micro bump pads 122 can be arranged with a pitch between 50 µm and 150 µm. The pillar pads 128 can be formed with a diameter between 55 µm and 165 µm. Further, in an example implementation, a seed layer can be formed over exposed portions of the underlying conductive layers 124. The seed layer and/or the forming thereof can share any or all characteristics with any other seed layer (e.g., micro bump seed layer, etc.) and/or the forming thereof discussed herein.

Each pad 122, 128 can comprise any of a variety of materials, non-limiting examples of which are provided herein. For example, each pad 122, 128 can comprise copper, aluminum, gold, silver, palladium, general conductive material, conductive material, equivalents thereof, combinations thereof, alloys thereof, any conductive material discussed herein, etc. In an example implementation, each pad 122, 128 can comprise Ni and Au. In another example implementation, each pad 122, 128 can comprise Ni, Au, and Cu. Each pad 122, 128 can be formed utilizing any of a variety of processes, non-limiting examples of which are provided herein. For example, each pad 122, 128 can be formed utilizing one or more of an electroless plating process, an electrolytic plating process, a sputtering process, etc.

The pads 122, 128 are shown in FIG. 2C extending past (or protruding from) the top surface of the upper-most dielectric layer 129, but the scope of this disclosure is not limited thereto. For example, the pads 122, 128 can comprise a top surface that is coplanar with the top surface of the upper-most dielectric layer 129, or can comprise a top surface that is below the top surface of the upper-most dielectric layer 129. Though generally shown comprising a cylindrical shape, the pads 122, 128 can comprise any of a variety of geometric configurations (e.g., square, rectangular, elliptical, etc.).

Figure 2D:
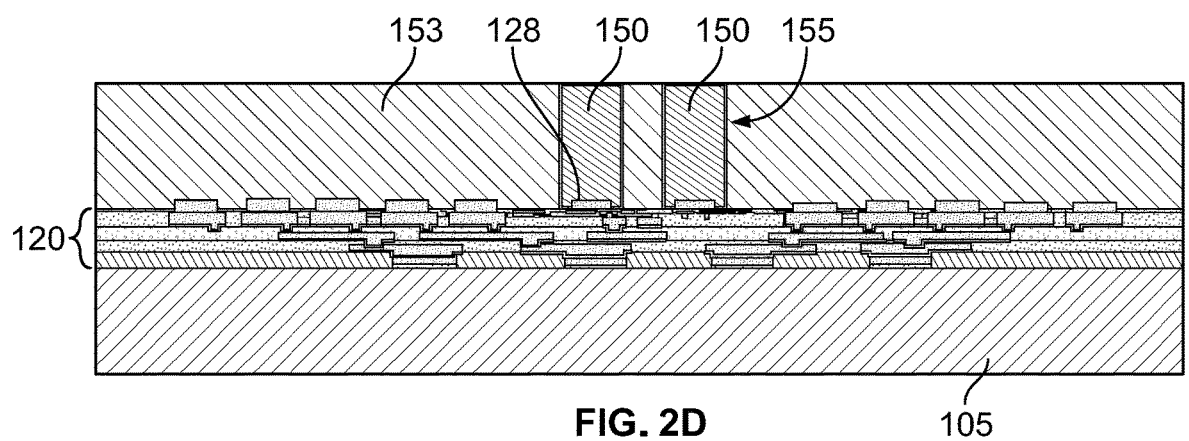

As shown in FIG. 2D, the pads 128 are shown positioned along a central portion of the first semiconductor device 100. Pillars 150 can be formed such that each of the pillars 150 is electrically connected to one or more underlying pads 128. Thus, each pillar 150 can be positioned above an underlying pad 128 and thus along the central portion of the first semiconductor device 100.

To this end, a resist layer 153 can be formed over the micro bump pads 122 and pillar pads 128. Holes 155 can then be formed through the resist layer 153 in any of a variety of manners (e.g., mechanical and/or laser ablation, chemical etching, photolithography, etc.). Each hole 155 can be formed over a respective pad 128, thus exposing such pads 128. The holes 155 can then be filled with conductive material (e.g., Cu, Ni, Al, Au, Ag, Pd, etc.) to form the pillars 150. In particular, the pillars 150 can be formed as a right circular cylinder. In some embodiments, the pillars 150 can have non-circular cross sections. Moreover, in some embodiments, the pillars 150 can be formed as a right frustum in which either the base surface or top surface is larger.

Figure 4:
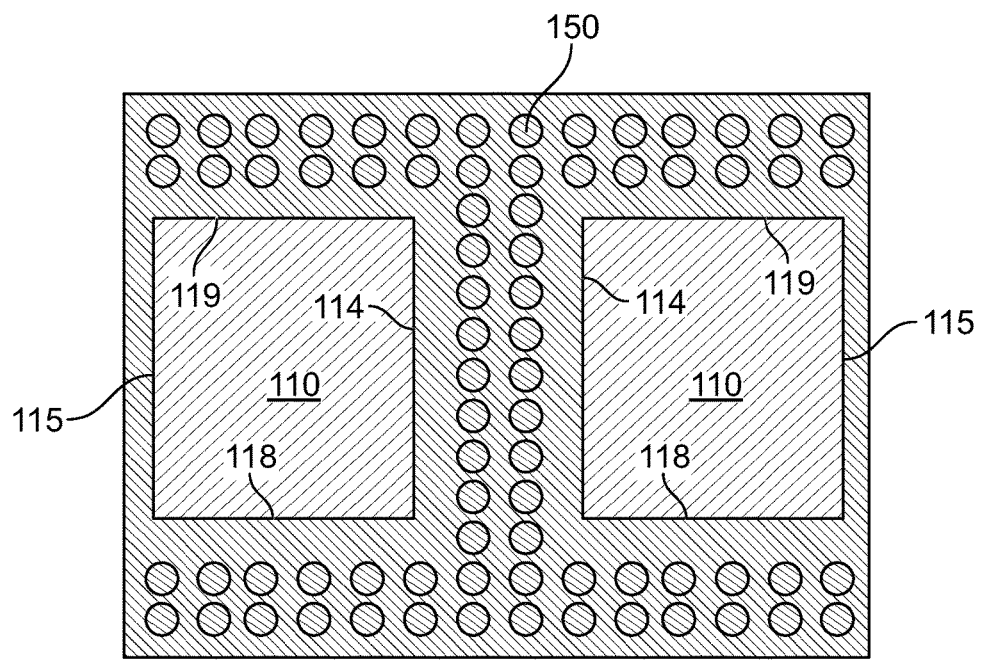
FIG. 4 shows a partially-fabricated first semiconductor device of the packaged semiconductor package of FIG. 1 or FIG. 3.

As shown in FIG. 4, the first semiconductor device 100 can include regions between sidewalls 115, 118, 119 of the first semiconductor devices and a sidewall of the first semiconductor device 100. In the depicted embodiment, pads 128 and associated pillars 150 can be positioned in the regions between the sidewalls 118, 119 and the associated sidewalls of the first semiconductor device 100, but not in the region between the sidewall 115 of the first semiconductor die 110 and its associated sidewall of the first semiconductor device 100. However, in other embodiments, a different subset of regions adjacent sidewalls 114, 115, 118, 119 can be left devoid of associated pillars 128. Leaving at least one region between the sidewalls 115, 118, 119 can permit extending and thermally coupling an internal heat distribution layer 170 on a semiconductor die 110 to an external heat distribution layer 17 disposed over an outer surface of the semiconductor package 10.

Figure 2E:
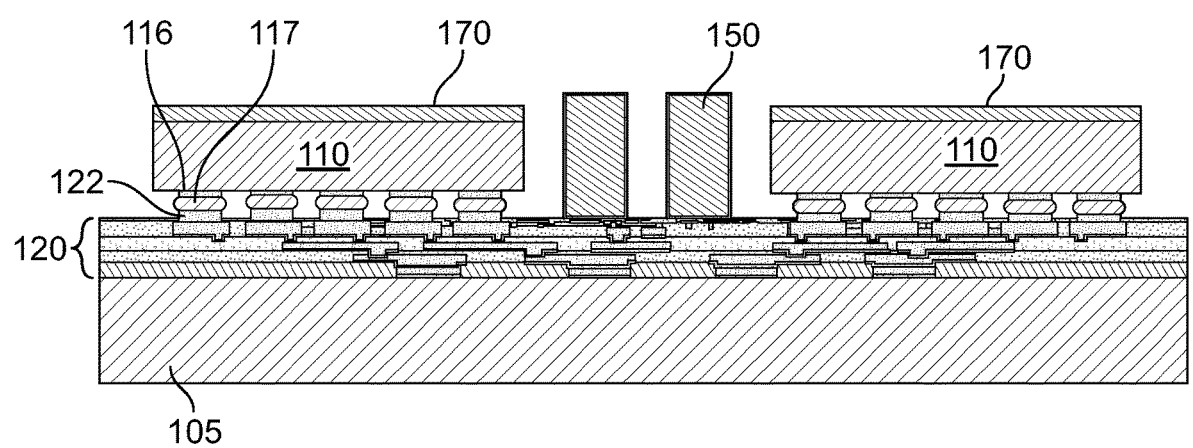

As shown in FIG. 2E, the resist layer 153 can be removed and first semiconductor dies 110 can be electrically connected to the pads 122. For example, each conductive bump 116 (or other conductive attachment structure) of the first semiconductor dies 110 can be electrically connected to a respective pad 122 through solder 117. The conductive bumps 116 of each first semiconductor die 110 can be attached to the pads 122 in any of a variety of manners, non-limiting examples of which are presented herein.

For example, the conductive bumps 116 (or other conductive attachment structure, for example conductive pillar, etc.) of each first semiconductor die 110 can be electrically connected to the pads 122 through the solder 117. In some embodiments, the term "bump" can refer to a conductive bump or pillar 116 and can also collectively refer to the pillar 116 and the solder 117 on the pillar 116. The conductive bumps 116 of the first semiconductor dies 110 can be attached to the pads 122 in any of a variety of manners, non-limiting examples of which are presented herein. For example, the conductive bumps 116 can be soldered to the pads 122 utilizing any of a variety of solder attachment processes (e.g., a mass reflow process, a thermal compression process, a laser soldering process, etc.). Also for example, the conductive bumps 116 can be coupled to the pads 122 utilizing a conductive adhesive, paste, etc. Additionally for example, the conductive bumps 116 can be coupled to the pads 122 utilizing a direct metal-to-metal (e.g., solderless) bond. In an example scenario, a solder paste can be applied to the pads 122 utilizing a stencil and squeegee, the conductive bumps 116 of the semiconductor die 110 can be positioned on or in the solder paste (e.g., utilizing a pick-and-place process), and the solder paste can then be reflowed. After attachment of the first semiconductor dies 110, the assembly can be cleaned (e.g., with hot DI water, etc.), subjected to a flux clean and bake process, subjected to a plasma treatment process, etc.

Figure 5:
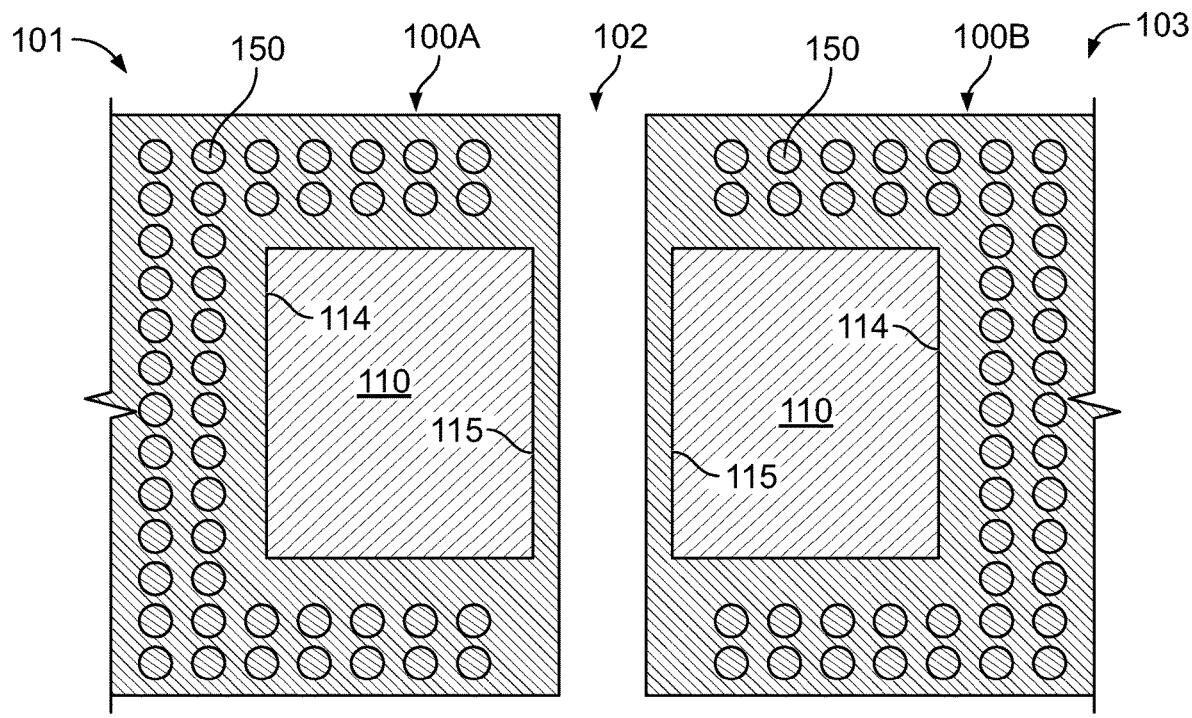
FIG. 5 shows two partially-fabricated first semiconductor devices of FIG. 4 separated by a saw street.

As further depicted in FIGS. 2E and 5, an internal heat distribution layer 170 can be formed directly upon at least the upper surface 111 of the first semiconductor dies 110. In particular, the internal heat distribution layer 170 can be formed such that internal heat distribution layer 170 is in direct physical and thermal contact with the first semiconductor dies 110. To this end, the internal heat distribution layer 170 can be formed using various thermally conductive materials. Examples of suitable thermally conductive materials for the internal heat distribution layer 170 can include, but are not limited to, copper (Cu), nickel (Ni), gold (Au), silver (Ag), platinum (Pt), cobalt (Co), titanium (Ti), chromium (Cr), zirconium (Zr), molybdenum (Mo), ruthenium (Ru), hafnium (Hf), tungsten (W), rhenium (Re), graphite, or carbon black.

A thickness of the internal heat distribution layer 170 can be in a range of, for example, approximately 0.1 μm to approximately 1000 μm, preferably 1 μm to 100 μm, and more preferably 3 μm to 30 μm, but aspects of the present disclosure are not limited thereto. When the thickness of the internal heat distribution layer 170 is smaller than 0.1 μm, thermal distribution efficiency of the internal heat distribution layer 170 can be smaller than a desired, threshold value, and when the thickness of the internal heat distribution layer 170 is greater than 1000 μm, a time required for forming the internal heat distribution layer 170 can be extended beyond an economically viable time frame. In addition, the internal heat distribution layer 170 can be formed, for example, by various processes such as sputtering, spin coating, spraying, printing, laminating, and/or a combination thereof, but are not limited thereto.

In some embodiments, the internal heat distribution layer 170 is formed on the top surface of the first semiconductor dies 110 prior to attaching the first semiconductor dies 110 to the pads 124. In such embodiments, the internal heat distribution layer 170 can further cover or partially cover one or more sidewalls 114, 115, 118, 119 of the first semiconductor dies 110.

Figure 6:
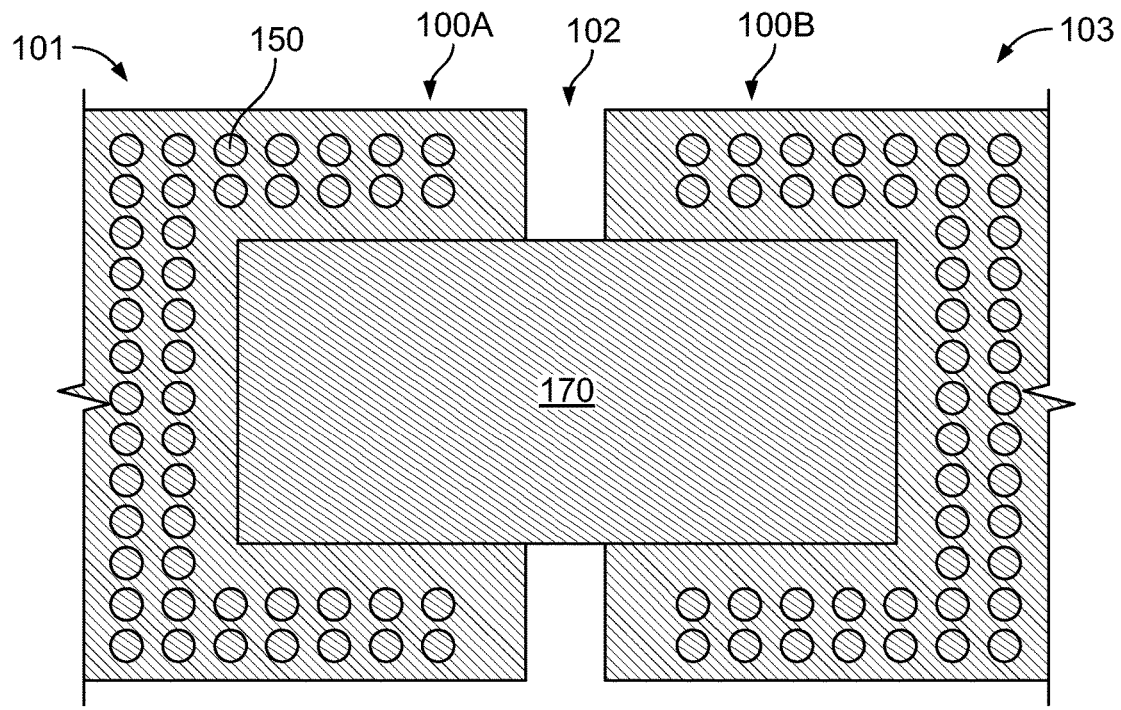
FIG. 6 shows the formation of an internal heat dissipation layer of the first semiconductor devices of FIG. 5.

In other embodiments, the internal heat distribution layer 170 can be formed after the first semiconductor dies 110 are attached to the pads 124. In such an embodiment, several first semiconductor devices 100 can be arrayed on the carrier 105 and separated by saw streets. For example, as shown in FIG. 5, a first semiconductor device 100A can be positioned adjacent to another first semiconductor device 100B. The first semiconductor devices 100A, 100B can each include two first semiconductor dies 110 and each device 100A, 100B can be implemented in the same manner as the first semiconductor device 100 of FIG. 1. As shown, the left-hand side portion 103 of the first semiconductor device 100B can be separated from the right-hand side portion 101 of the second semiconductor device 100B via a saw street 102. The internal heat distribution layer 170 can then be formed over the top surface 111 of the first semiconductor dies 110 such that the internal heat distribution layer 170 spans across the saw street 102 as shown in FIG. 6.

Figure 2F:
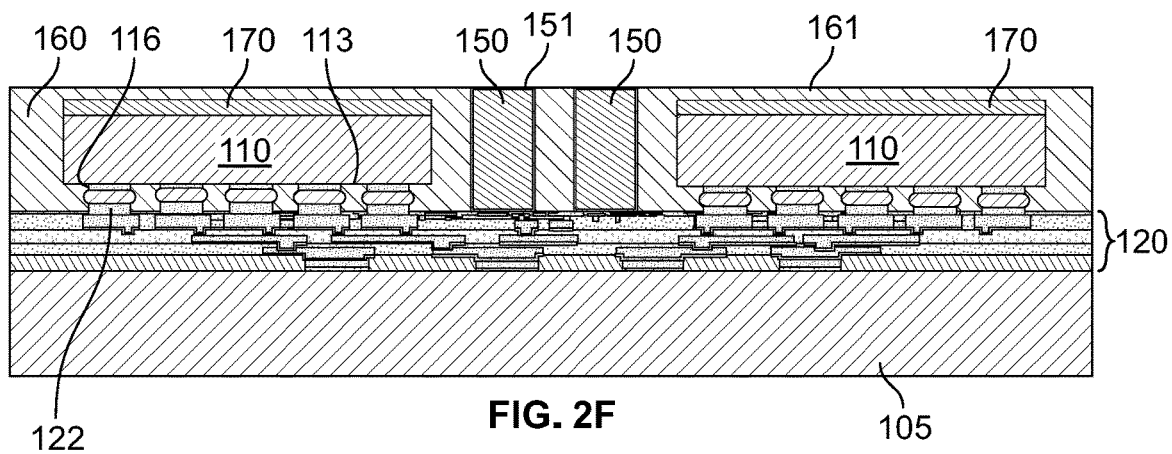

After forming the internal heat distribution layer 170, the semiconductor die 110 and substrate 120 can be encapsulated with an encapsulant 160 as shown in FIG. 2F. The encapsulant 160 can comprise, for example, an encapsulating material, molding resin, or other non-conductive material. Moreover, the encapsulant 160 can be cured in order to harden the encapsulant 160 and further protect the encapsulated first semiconductor dies 110. In an example implementation, the encapsulant 160 surrounds the pillars 150 and the first semiconductor dies 110. Moreover, the encapsulant 160 can cover the internal heat distribution layer 170 such that the encapsulant 160 is in direct contact with an upper surface of the internal heat distribution layer 170 as shown.

The encapsulant 160 can be formed in any of a variety of manners (e.g., compression molding, transfer molding, flood molding, etc.). The encapsulant 160 can comprise any of a variety of types of encapsulating materials. For example, the encapsulant 160 can comprise a single layer of non-conductive material, such as a resin, a polymer composite material, a polymer having a filler, an epoxy resin, an epoxy acrylate having a filler such as silica or other inorganic material, a mold compound, a silicone resin, and/or a resin-impregnated B-stage pre-preg film, among others. Moreover, the size of a filler (e.g., in inorganic filler or other particle component) of the encapsulant 160 can be smaller (or substantially smaller) than the size of a space or a gap between the substrate 120 and the first semiconductor dies 110. In such embodiments, the encapsulant 160 can fill a space or gap between the substrate 120 and a bottom surface of the first semiconductor dies 110.

If the size of the filler is too large to fill the gap between the substrate 120 and the bottom surface 113 of the first semiconductor dies 110, a separate underfill material (not shown) can be used to fill the space or gap between the substrate 120 and the first semiconductor dies 110. In such embodiments, the underfill can be formed between the first semiconductor die 110 and the substrate 120 prior to encapsulating the first semiconductor dies 110 with encapsulant 160. Such underfill can surround and encapsulate portions of the conductive bumps 116 and pads 122 that are exposed to the underfill. The underfill can comprise any of a variety of underfill materials. Also the underfill can be formed utilizing any of a variety of processes (e.g., a capillary underfilling process, utilizing a pre-applied underfill material, etc.). The underfill between the semiconductor die 110 and the substrate 120 can prevent or reduce warpage due to, for example, thermal expansion coefficient differences between the semiconductor die 110 and the substrate 120.

Still referring to FIG. 2F, the encapsulant 160 and pillars 150 can be planarized via a mold-grinding process. In particular, a chemical/mechanical grinding process can be utilized to remove excess encapsulant 160. In particular, the mold-grinding process can form a planarized upper surface in which an upper surface 161 of the encapsulant 160 and upper surfaces 151 of the pillars 150 are coplanar. In another example implementation, the mold-grinding process can remove the encapsulant 160 over the upper surface of the first semiconductor dies 110. In particular, the mold-grinding process can form a planarized upper surface in which the upper surface of the encapsulant 160, upper surfaces of the pillars 150, and the upper surface of the internal heat distribution layer 170 are coplanar.

Figure 2G:
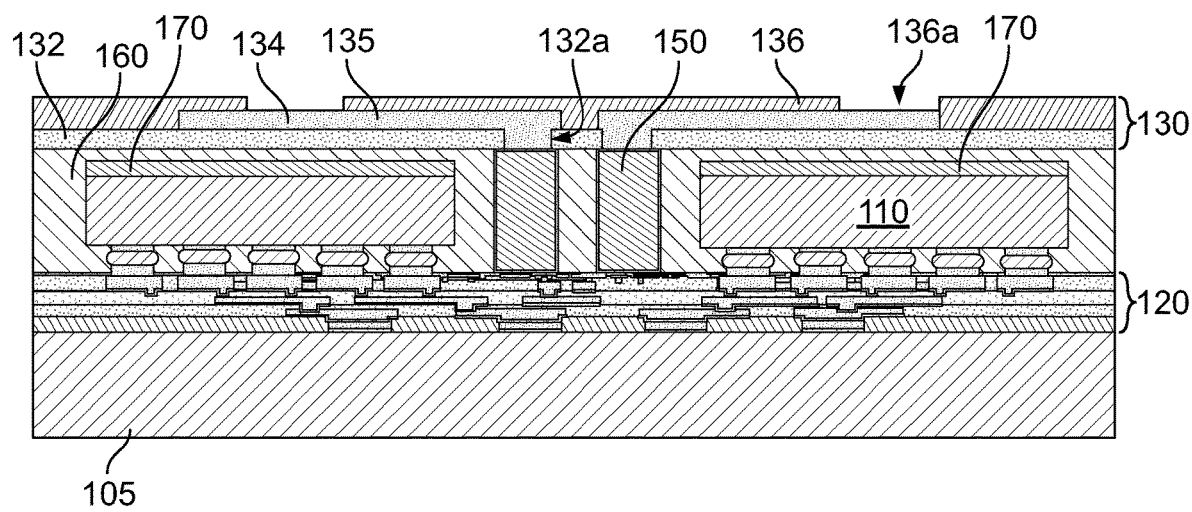

As shown in FIG. 2G, an upper surface 161 of the encapsulant 160 and the conductive pillars 150 can be covered with a first dielectric layer 132 of the interposer 130. Also, openings 132a can be formed in the first dielectric layer 132 to expose pillars 150. In one example implementation, a seed layer (not shown) can be formed at the inside of the openings 132a such as, for example, on side walls of the openings 132a formed in the first dielectric layer 132 and/or on the pillars 150 exposed by the openings 132a. In addition to or alternatively, the seed layer can be formed outside of the openings 132a such as, for example, on the top surface of the first dielectric layer 132. As discussed herein, the seed layer can be formed using the same materials and/or processes as used to form the other seed layers, or can be formed using different respective materials and/or processes.

Continuing the example implementation, a conductive layer 134 of the interposer 130 can be formed on the seed layer. For example, the conductive layer 134 can be formed to fill or at least cover side surfaces of the openings 132a in the first dielectric layer 132. The conductive layer 134 can be formed using the same materials and/or processes as the other conductive or redistribution layers, or can be formed using different respective materials and/or processes. The conductive layer 134 can also be referred to herein as a redistribution layer. In some embodiments, the conductive layer 134 can be similar to or formed in a similar way as conductive layer 124. In the same or other embodiments, the dielectric layer 132 can be similar to or formed in a similar way as dielectric layer 129.

The conductive layer 134 can then be covered with a second dielectric layer 136 of the interposer 130. The second dielectric layer 136 and/or the forming thereof can share any or all characteristics with other dielectric layers and/or the forming thereof discussed herein. Openings or apertures 136a can be formed in the second dielectric layer 136 to expose specific areas of the conductive layer 134 through such openings 136a. The openings 136a can be formed in any of a variety of manners such as, for example, mechanical and/or laser ablation, chemical etching, etc. Alternatively, for example, the second dielectric layer 136 can be originally formed with the openings 136a therein. A seed layer can be formed at the inside of the openings 136a and/or outside of the openings 136a. The seed layer and/or the forming thereof can share any or all characteristics with any other seed layer and/or the forming thereof discussed herein.

Figure 2H:
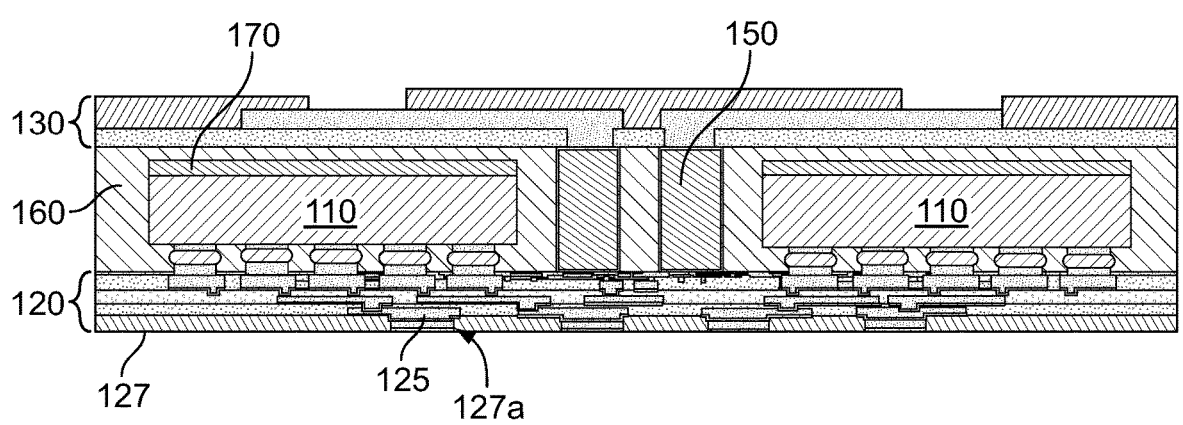

As shown in FIG. 2H, the carrier 105 can be removed from the under bump metal 125 and the first dielectric layer 127. For example, most or all of the carrier 105 can be removed through a mechanical grinding process. Any remaining carrier 105 can be removed through a chemical etching process. The removing of the carrier 105 can, for example, share any or all characteristics with any carrier removing discussed herein. In an example implementation, after removal of the carrier 105, the under bump metal 125 can be exposed through the openings 127a in the first dielectric layer 127. The bottom surfaces of the under bump metal 125 can be coplanar with the bottom surface of the first dielectric layer 127.

In some implementations, the carrier 105 can be attached to the first dielectric layer 127 and/or to the under bump metal 125 utilizing a temporary adhesive that loses it adhesion or a substantial portion thereof when exposed to thermal energy, laser or light energy, chemical agents, etc. The separation of the carrier 105 from the first dielectric layer 127 and/or under bump metal 125 can be performed by exposing the temporary adhesive to the energy and/or chemicals that cause the adhesive to loosen.

Figure 2I:
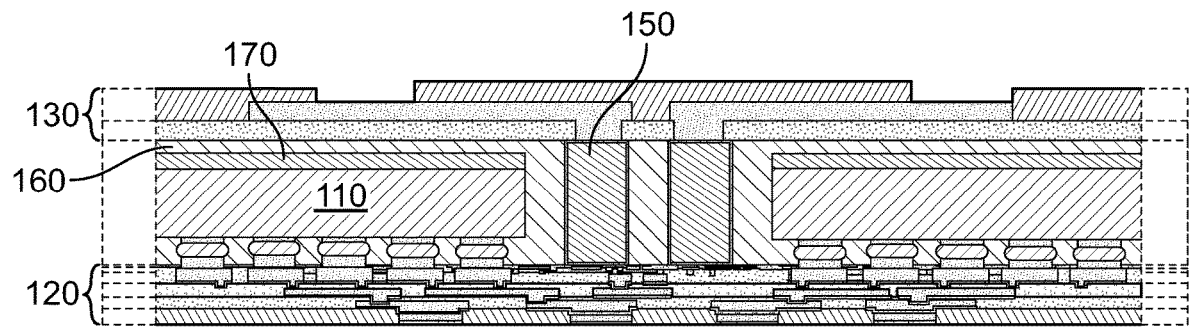
Figure 7:
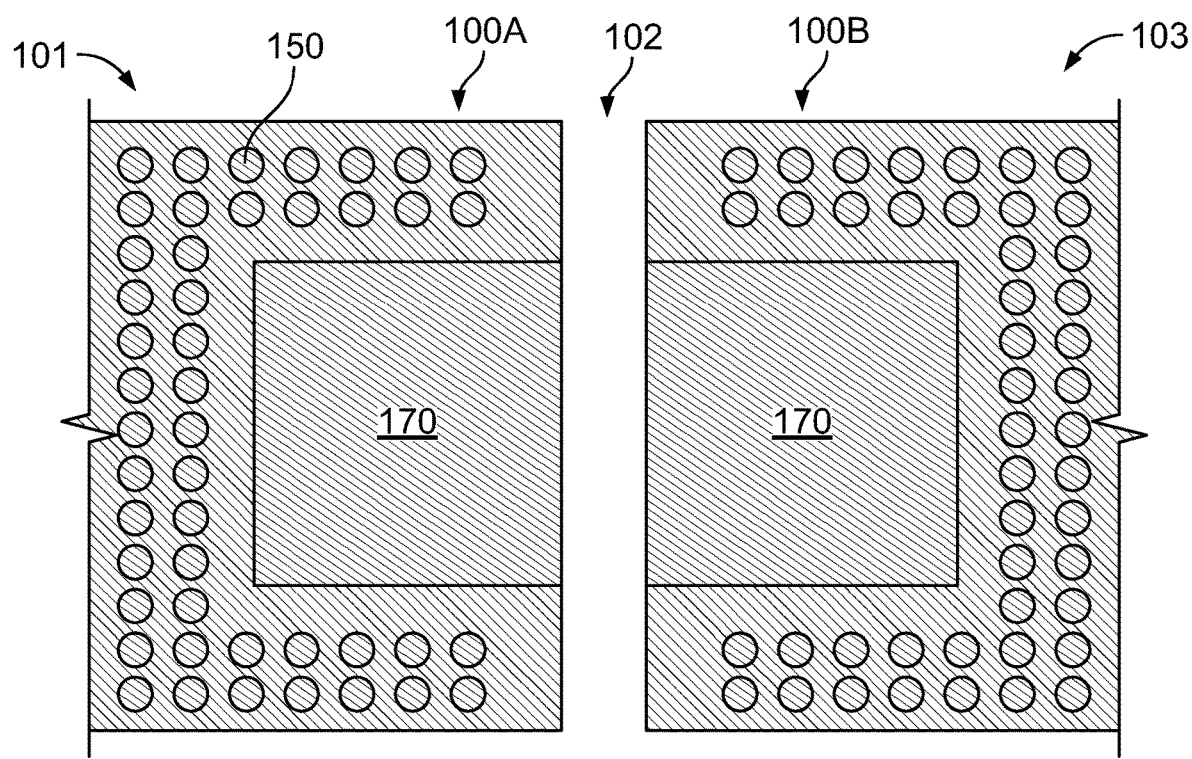
FIG. 7 shows the first semiconductor devices of FIG. 6 after a singulation process.

Referring now to FIG. 2I, the first semiconductor device 100 can undergo a singulation, sawing, or dicing process. After separating of the carrier 105 (or before such separation), the substrate 120, the encapsulant 160, the heat distribution layers 170, and the first semiconductor dies 110 can be singulated or cut (e.g., sawn by a diamond blade, laser beam, etc.). In particular, a cutting tool can travel along streets 102 as shown in FIG. 7 thus cutting through the substrate 120, interposer 130, the encapsulant 160, and the internal heat distribution layer 170. In such a scenario, side surfaces of the substrate 120, the interposer 130, the encapsulant 160, and the heat distribution layers 170 can be made coplanar by such a singulation process. Thus, as a result of the singulation process, the heat distribution layers 170 can be exposed via side surfaces of the first semiconductor device 100.

Figure 2J:
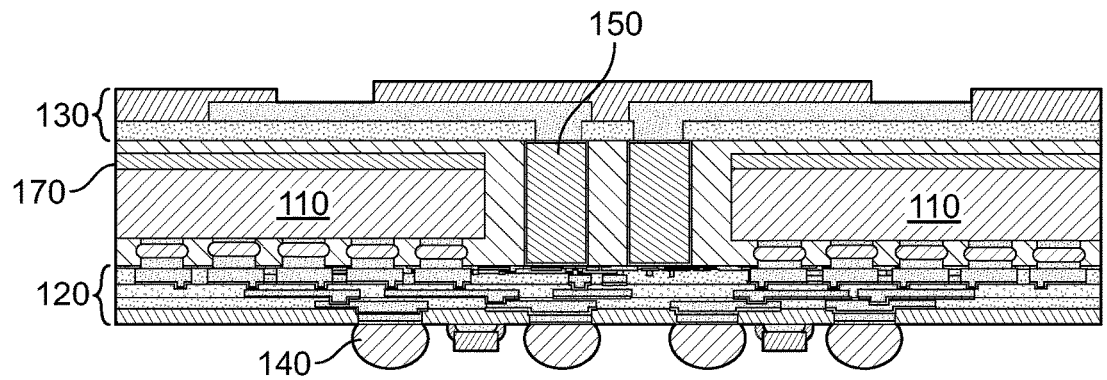

As further shown in FIG. 2J, the conductive balls 140 can be electrically connected to the exposed under bump metal 125. The conductive balls 140 can comprise any of a variety of characteristics, non-limiting examples of which are presented herein. For example, the conductive balls 140 can be formed of one of a eutectic solder (Sn37Pb), a high lead solder (Sn95Pb), a lead-free solder (SnAg, SnAu, SnCu, SnZn, SnZnBi, SnAgCu, and SnAgBi), combination thereof, equivalents thereof, etc. The balls and/or any external electrical connector 140 discussed herein can comprise a conductive ball (e.g., a solder ball, a copper-core solder ball, etc.), a conductive bump, a conductive pillar or post (e.g., a copper pillar, a solder-capped copper pillar, a wire, etc.), etc.

The conductive balls 140 can be connected to the under bump metal 125 utilizing any of a variety of reflow and/or plating processes. For example, volatile flux can be deposited (e.g., dotted, printed, etc.) on the under bump metal 125, the conductive balls 140 can be deposited (e.g., dropped, etc.) on the volatile flux, and then a reflow temperature of about 150° C. to about 250° C. can be provided. At this point, the volatile flux can be volatized and completely removed.

The conductive balls 140, as mentioned above, can be referred to as a conductive bump, a conductive ball, a conductive pillar, a conductive post, a conductive wire, etc., and can, for example, be mounted on a rigid printed circuit board, a flexible printed circuit board, a lead frame, etc. Such balls 140 can permit electrically connecting the first semiconductor dies 110 of the first semiconductor device 100 to a variety of substrates (e.g., motherboard substrates, packaging substrates, lead frame substrates, etc.).

Figure 2K:
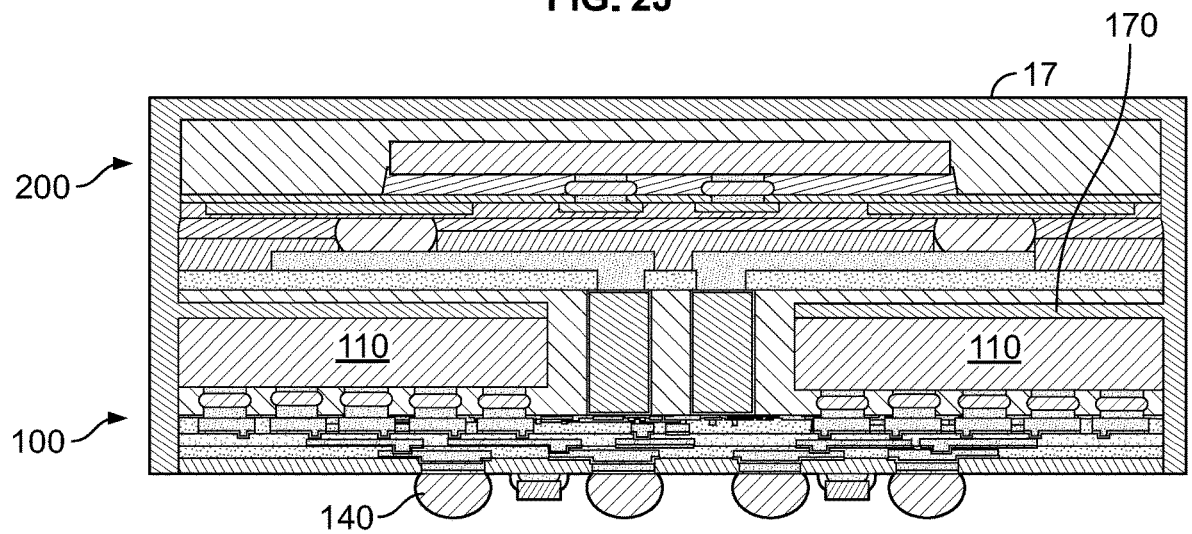

Finally, as shown in FIG. 2K, the second semiconductor device 200 can be operatively coupled to the first semiconductor device 100. In particular, conductive electrical connectors 240 of the second semiconductor device 200 can be electrically connected to the conductive layer 134 of the interposer 130 via openings 132a in the first dielectric layer 132.

After coupling the second semiconductor device 200 to the first semiconductor device 100, an external heat distribution layer 17 can be formed directly upon an upper surface of the second semiconductor device 200 and sidewall surfaces of the first and second semiconductor devices 100, 200. In particular, the external heat distribution layer 17 can generally encapsulate both the first and second semiconductor device 100, 200 and generally provide an outer surface of the semiconductor package 10. To this end, the external heat distribution layer 17 can be formed using various conductive materials. Examples of suitable conductive materials for the external heat distribution layer 17 can include, but are not limited to, copper (Cu), nickel (Ni), gold (Au), silver (Ag), platinum (Pt), cobalt (Co), titanium (Ti), chromium (Cr), zirconium (Zr), molybdenum (Mo), ruthenium (Ru), hafnium (Hf), tungsten (W), rhenium (Re), graphite, or carbon black.

A thickness of the external heat distribution layer 17 can be in a range of, for example, approximately 0.1 µm to approximately 1000 µm, preferably 1 µm to 100 µm, and more preferably 3 µm to 30 µm, but aspects of the present disclosure are not limited thereto. When the thickness of the external heat distribution layer 17 is smaller than 0.1 m, thermal distribution efficiency of the external heat distribution layer 17 can be smaller than a desired, threshold value, and when the thickness of the external heat distribution layer 17 is greater than 1000 µm, a time required for forming the external heat distribution layer 17 can be extended beyond an economically viable time frame. In addition, the external heat distribution layer 17 can be formed as a conformal layer or coating that conforms to the contours of the surfaces upon which it is deposited by, for example, processes such as sputtering, spin coating, spraying, printing, laminating, and/or a combination thereof, but are not limited thereto.

Figure 3:
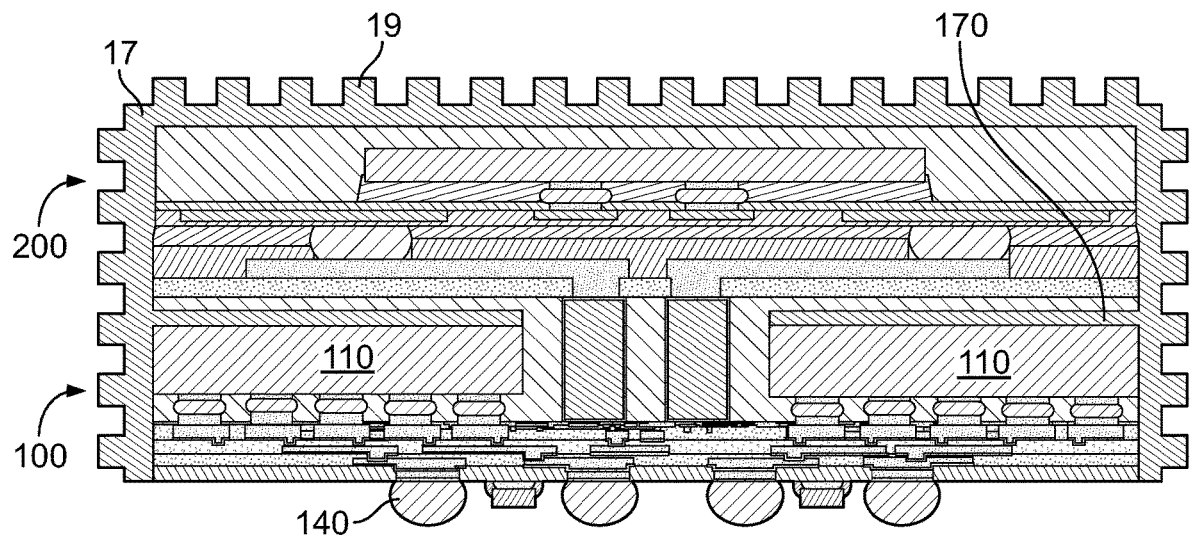
FIG. 3 shows a vertical cross-section of another example embodiment of a semiconductor package in accordance with various aspects of the present disclosure.

FIGS. 1 and 2K depict an external heat distribution layer 17 that provides a generally planar or smooth outer surface of the semiconductor package 10. In other embodiments, the external heat distribution layer 17 can include fins 19 as shown in FIG. 3. The fins 19 can protrude or extend from the upper surface of one or more side surfaces of the semiconductor package 10. Such fins 19 effectively increase the surface area of the external heat distribution layer 17 thus increasing the efficiency of the external heat distribution layer 17 to dissipate or transfer heat to the surrounding environment.

While the foregoing has been described with reference to certain aspects and examples, those skilled in the art understand that various changes can be made and equivalents can be substituted without departing from the scope of the disclosure. In addition, many modifications can be made to adapt a particular situation or material to the teachings of the disclosure without departing from its scope. Therefore, it is intended that the disclosure not be limited to the particular examples disclosed, but that the disclosure includes all examples falling within the scope of the appended claims.

What is claimed is:

1. A semiconductor package, comprising:
   a substrate comprising a substrate top side and a substrate bottom side;
   a semiconductor component comprising a component top side, a component bottom side coupled to the substrate top side, and a component sidewall between the component top side and the component bottom side;
   an internal heat distribution layer comprising an internal heat distribution layer top side, an internal heat distribution layer bottom side thermally coupled to the component top side, and an internal heat distribution layer sidewall between the internal heat distribution layer top side and the internal heat distribution layer bottom side;
   an encapsulant comprising an encapsulant top side, an encapsulant bottom side covering portions of the substrate top side, and an encapsulant sidewall between the encapsulant top side and the encapsulant bottom side, wherein the encapsulant encapsulates the semiconductor component; and
   an external heat distribution layer that:
   traverses and contacts the encapsulant sidewall;

traverses the component sidewall; and
contacts the internal heat distribution layer at a location adjacent the component sidewall.

2. The semiconductor package of claim 1, wherein the external heat distribution layer contacts the component sidewall.

3. The semiconductor package of claim 1, comprising fins projecting from the external heat distribution layer.

4. The semiconductor package of claim 1, comprising:
a conductive interconnect structure comprising an interconnect structure upper end and an interconnect structure lower end;
wherein the interconnect structure lower end is coupled to the substrate top side; and
wherein the encapsulant encapsulates the conductive interconnect structure without covering the interconnect structure upper end.

5. The semiconductor package of claim 4, comprising:
a semiconductor device over the encapsulant top side; and
wherein the semiconductor device is coupled to the interconnect structure upper end.

6. The semiconductor package of claim 4, comprising:
an upper substrate over the encapsulant top side; and
wherein the upper substrate comprises an upper substrate bottom side coupled to the interconnect structure upper end.

7. The semiconductor package of claim 6, comprising:
a semiconductor device;
wherein the upper substrate comprises an upper substrate top side;
wherein the upper substrate top side comprises openings that expose conductive portions of the upper substrate; and
wherein the semiconductor device is coupled to the conductive portions exposed by the openings in the upper substrate top side.

8. The semiconductor package of claim 4, comprising:
another semiconductor component that is coupled to the substrate top side; and
the conductive interconnect structure passes between adjacent sidewalls of the semiconductor components.

9. A semiconductor package, comprising:
a substrate comprising a substrate top side, a substrate bottom side, and a substrate sidewall between the substrate top side and the substrate bottom side;
a first semiconductor component comprising a first component top side, a first component bottom side that is coupled to the substrate top side, and a first component sidewall between the first component top side and the first component bottom side;
a first internal electro-magnetic-interference (EMI) shield layer that covers at least the first component top side;
an external EMI shield layer that covers the first internal EMI shield layer, the first component top side, the first component sidewall, the substrate top side, and the substrate sidewall; and
a conductive pillar comprising:
a pillar lower end that is coupled to the substrate top side;
a pillar upper end that vertically extends beyond a top side of the first internal EMI shield layer; and
a pillar lateral side that extends from the pillar lower end to the pillar upper end.

10. The semiconductor package of claim 9, wherein the external EMI shield layer contacts the first internal EMI shield layer.

11. The semiconductor package of claim 9, comprising:
a second semiconductor component comprising a second component top side, a second component bottom side that is coupled to the substrate top side, and a second component sidewall between the second component top side and the second component bottom side; and
a second internal EMI shield layer that covers at least the second component top side; and
wherein the external EMI shield layer covers the second internal EMI shield layer.

12. The semiconductor package of claim 11, wherein:
the first component sidewall is adjacent the second component sidewall; and
the conductive pillar passes between the first component sidewall and the second component sidewall.

13. The semiconductor package of claim 12, comprising:
an encapsulant comprising an encapsulant top side, encapsulant bottom side covering portions of the substrate top side, and an encapsulant sidewall between the encapsulant top side and the encapsulant bottom side;
wherein the encapsulant encapsulates the first semiconductor component, the second semiconductor component, and the conductive pillar; and
wherein the external EMI shield layer covers the encapsulant top side and the encapsulant sidewall.

14. The semiconductor package of claim 13, comprising:
an upper substrate over the encapsulant top side; and
wherein the upper substrate comprises an upper substrate bottom side coupled to the pillar upper end.

15. The semiconductor package of claim 14, comprising a semiconductor device coupled to the substrate via the upper substrate and the conductive pillar.

16. The semiconductor package of claim 15, wherein the external EMI shield layer covers the semiconductor device.

17. The semiconductor package of claim 13, comprising a semiconductor device coupled to the pillar upper end.

18. The semiconductor package of claim 17, wherein the external EMI shield layer covers the semiconductor device.

19. A method, comprising:
providing a substrate with a semiconductor component coupled to a top side of the substrate, an internal heat distribution layer thermally coupled to a top side of the semiconductor component, a conductive pillar comprising a pillar lower end that is coupled to the top side of the substrate, a pillar upper end that vertically extends beyond a top side of the internal heat distribution layer, and a pillar lateral side that extends from the pillar lower end to the pillar upper end, and an encapsulant that encapsulates the semiconductor component, the internal heat distribution layer, the conductive pillar, and portions of the top side of the substrate; and
covering the semiconductor component, the internal heat distribution layer, the encapsulant, and the substrate with an external heat distribution layer that contacts the internal heat distribution layer.

20. The method of claim 19, comprising:
coupling, prior to covering with the external heat distribution layer, a semiconductor device to the pillar upper end; and
wherein the external heat distribution layer covers the semiconductor device.

* * * * *